United States Patent [19]

Ballough et al.

[11] Patent Number: 4,564,914

[45] Date of Patent: Jan. 14, 1986

[54] METHOD FOR MACHINING THREE DIMENSIONAL CONTOURS UTILIZING A NUMERICALLY CONTROLLED LATHE

[75] Inventors: Douglas M. Ballough, Issaquah; Howard L. Higginbotham, Renton, both of Wash.

[73] Assignee: The Boeing Company, Seattle, Wash.

[21] Appl. No.: 523,197

[22] PCT Filed: Jul. 28, 1983

[86] PCT No.: PCT/US83/01160

§ 371 Date: Jul. 28, 1983

§ 102(e) Date: Jul. 28, 1983

[87] PCT Pub. No.: WO85/00067

PCT Pub. Date: Feb. 14, 1985

[51] Int. Cl.$^4$ .................. G05B 19/18; G06F 15/46
[52] U.S. Cl. .................. 364/475; 82/2 B; 82/1 C; 318/572; 364/167
[58] Field of Search ............. 364/474, 475, 167–171; 318/567, 569, 570, 572, 573, 574; 82/2 R, 2 B, 1 C, 11, 14 B, 18, 21 R, 21 B; 51/165.71, 97 NC

[56] References Cited

U.S. PATENT DOCUMENTS

| | | | |
|---|---|---|---|
| 3,698,268 | 10/1972 | Cutler | 82/2 B |
| 3,715,938 | 2/1973 | Ledergerber et al. | 82/1 C |
| 3,766,369 | 10/1973 | Watanabe et al. | 318/570 X |
| 3,875,382 | 4/1975 | Cutler | 364/474 X |
| 4,027,245 | 5/1977 | Bourrat | 364/474 |
| 4,033,206 | 7/1977 | Morita et al. | 82/2 B |
| 4,074,349 | 2/1978 | Ueda | 364/474 X |
| 4,135,238 | 1/1979 | Hamill, III et al. | 364/474 X |
| 4,214,309 | 7/1980 | Koide et al. | 364/474 |
| 4,250,551 | 2/1981 | Paveglio, Jr. et al. | 82/1 C X |
| 4,250,779 | 2/1981 | Feller et al. | 82/2 B X |
| 4,314,492 | 2/1982 | Feller et al. | 82/2 B X |
| 4,365,301 | 12/1982 | Arnold et al. | 364/475 |
| 4,366,543 | 12/1982 | Feller et al. | 364/474 |

*Primary Examiner*—Joseph Ruggiero
*Attorney, Agent, or Firm*—J. P. Hamley; B. A. Donahue

[57] ABSTRACT

A computing unit (12) produces control signals which, when applied to the control inputs of a conventional numerically controlled lathe (10), cause the lathe cutting tool (60) to be positioned such that contours varying in three dimensions may be realized in a spindle (18) mounted, rotating workpiece (20). The control signals include x and z position signals, defining the position of the cutting tool with respect to the radial (24) and axial (22) axes, respectively, of the workpiece (20), and i and k lead control signals which define the distance traveled by the cutting tool, per revolution of the workpiece, in the radial (24) and axial (22) workpiece axes, respectively.

A filtering process (134, 136, 140) operates to delete each control signal having i and k values which are within the x and z tolerance values, respectively, of the immediately preceding control signal, to thereby reduce both the volume of stored data and machining time.

19 Claims, 12 Drawing Figures

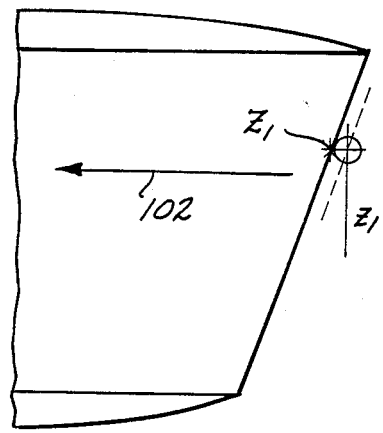
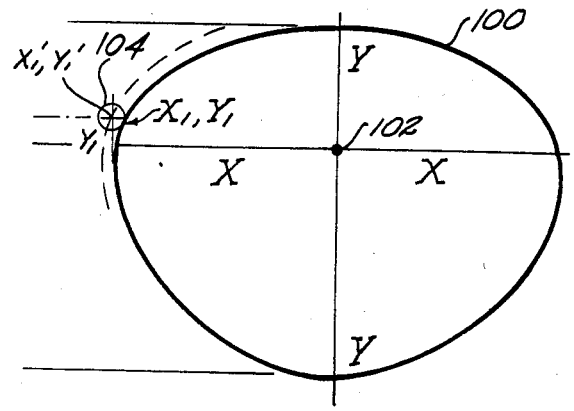
Fig. 5B.  Fig. 5A.
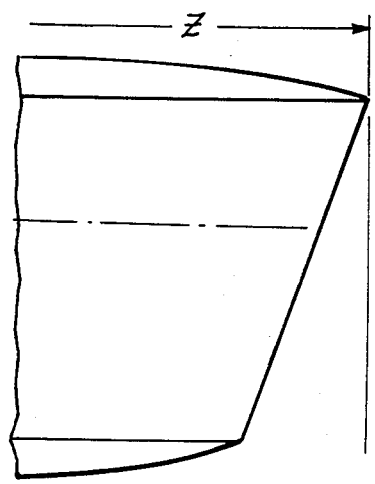
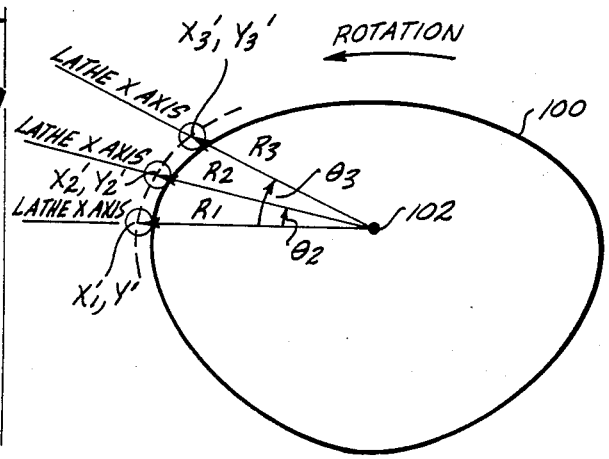
Fig. 6B.  Fig. 6A.

METHOD FOR MACHINING THREE DIMENSIONAL CONTOURS UTILIZING A NUMERICALLY CONTROLLED LATHE

BACKGROUND OF THE INVENTION

This invention relates to a method for the machining of a workpiece and, more particularly, to a method for operating a numerically controlled lathe to accomplish three dimensional workpiece contouring.

Typically, numerically controlled mills have been used in the machining of workpieces which require contouring in three dimensions. The milling tool, under computer control, produces cuts in the workpiece which define the desired three dimensional contouring.

A problem with the numerically controlled milling process is that it is relatively labor intensive. The milling of a part often requires manual intervention to reposition the part on the bed of the mill. Such repositioning is often critical to successful part fabrication and, as such, requires a significant amount of time by a skilled operator.

In addition, a mill produced part often requires substantial handwork, such as filing, to produce a finished part.

A numerically controlled lathe provides a much faster way of machining workpieces. Here, a workpiece is mounted to a rotating spindle. A cutting tool may be positioned with respect to the radial and axial axes of the workpiece under computer control. Thus, as the workpiece rotates, the cutting tool moves both axially and radially to cut the desired shape. Inasmuch as the workpiece need be positioned only once by an operator, the lathe process is substantially less labor intensive than is the milling process.

A drawback to the lathe process is, however, that heretofore it has only been useful for two dimensional contouring of a part. Prior attempts at adapting a numerically controlled lathe for three dimensional contouring have failed due to the complexities involved in reducing design information into suitable lathe control signals and to the volume of control signals which would be required to realize three dimensional lathe contouring.

SUMMARY OF THE INVENTION

It is desirable, therefore, to provide a method for machining three dimensional contours into a workpiece utilizing a numerically controlled lathe.

It is particularly desirable to provide the above method in a form which permits efficient reduction of design data into lathe control signals.

A yet further desirable feature is to provide the above method in a form which allows reduction of the data necessary to define the three dimensional contour.

Briefly, according to the invention, a method for machining a workpiece comprises the first step of providing a rotatable lathe spindle including means for mounting the workpiece thereto such that the workpiece may be rotated about a rotational axis. A cutting tool is provided as is positioning means which positions the cutting tool in response to applied control signals. The positioning means is operable to position the cutting tool with respect to both a first axis perpendicular to the axis of rotation of the spindle mounted workpiece and a second axis parallel to the axis of rotation of the spindle mounted workpiece, thereby positioning the cutting tool both radially and axially with respect to the workpiece. A set of control signals x, z, i and k are produced for each predetermined segment of rotation of the workpiece. The x control signal defines the position of the cutting tool in the first axis whereas the z control signal defines the position of the cutting tool in the second axis. Each i control signal defines the distance traveled by the cutting tool in the first axis for each revolution of the workpiece with each k control signal defining the distance traveled by the cutting tool in the second axis for each revolution of the workpiece.

More specifically, the desired machined shape of the workpiece is defined in a Cartesian coordinate system using mutually orthogonal axes having corresponding coordinates X, Y and Z. The X, Y and Z coordinates are compensated for offsets produced by the cutting tool to produce corresponding coordinates x', y' and z. The x', y' coordinates are converted to corresponding polar coordinates of radius R and angle $\theta$. A set of X coordinates is defined, each X coordinate being predeterminedly related to one of the R coordinates. A set of i coordinates are calculated, each i coordinate being a predetermined function of said R and $\theta$ coordinates. A set of k coordinates are calculated, each k coordinate being a predetermined function of the z and $\theta$ coordinates. The x, z, i and k control signals are produced in response to said x, z, i and k coordinates, respectively.

To reduce the total volume of data required to define a three dimensional contour, successive i, k control signals are compared to the i, k values of the immediately preceding control signal. Those x, z, i and k control signals whose i, k values are predeterminedly related to the i, k values of the immediately preceding control signal are deleted.

BRIEF DESCRIPTION OF THE DRAWINGS

FIGS. 5A, 5B are face and side plan views, respectively, of a contour of the desired machined workpiece, illustrating definition of the contour by the use of a Cartesian coordinate system and compensation for the radius of the cutting tool;

FIGS. 6A, 6B are face and side plan views, respectively, of a contour of the desired machined workpiece illustrating conversion of the Cartesian coordinates to polar coordinates;

DETAILED DESCRIPTION

Figure 1:
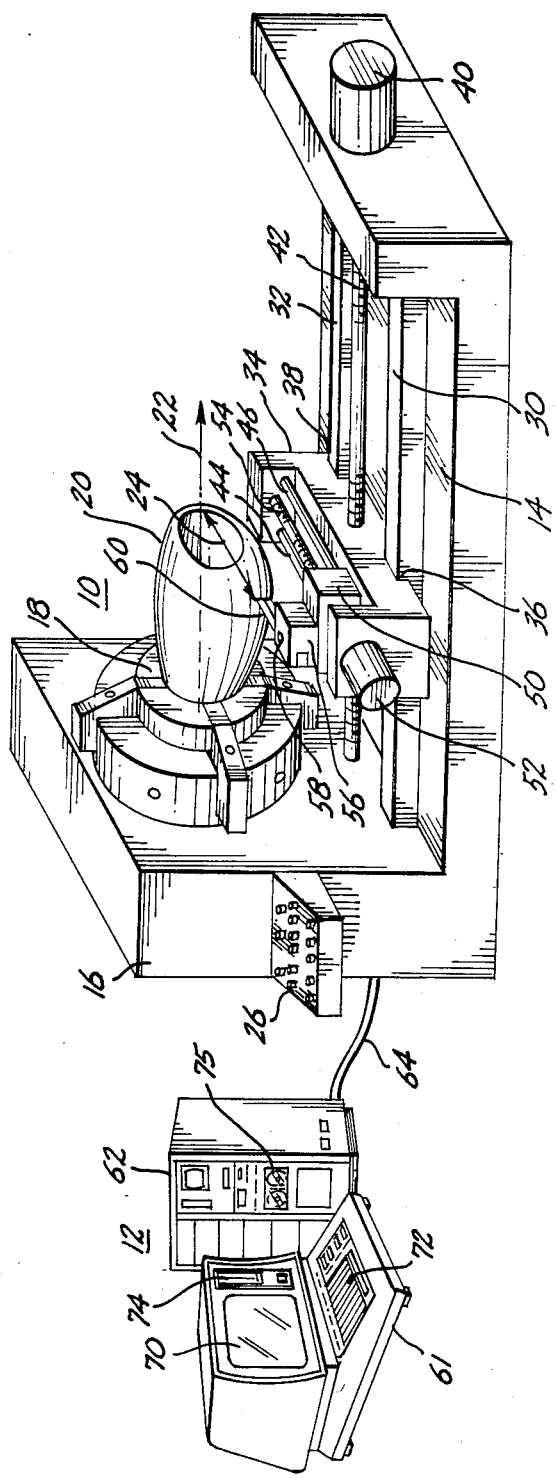
FIG. 1 is a perspective view illustrating the machining of a three dimensional nacelle cowl on a numerically controlled lathe, which lathe is under control of a computer and user terminal.

FIG. 1 is a perspective view of a numerically controlled lathe, indicated generally at 10 and a computer control for the lathe, indicated generally at 12.

The numerically controlled lathe 10 is a generally L-shaped structure, having one leg forming a bed 14 and the remaining, upstanding leg forming a support portion 16. Extending from a face of the support portion 16 in position over the bed 14 is a spindle assembly 18. Spindle assembly 18 is rotatably driven by a motor (not shown) contained within support portion 16. The rotational speed of spindle assembly 18 is precisely controlled by control of its associated motor which, in turn, is controlled by computer control 12.

Shown mounted on spindle assembly 18, for rotation therewith, is a workpiece 20. For purposes of illustration, the workpiece 20 is shown to be a nacelle cowl, as might be used, for example, on model aircraft used in wind tunnel testing. The rotational, or axial axis of the workpiece 20 is normal to the face of spindle 18 and parallel to the longitudinal axis of bed 14 as shown by arrow 22, whereas the radial axis of workpiece 20 is normal to rotational axis 22 as depicted by arrow 24.

Also supported by the support portion 16 is an operator's control panel 26. Control panel 26 contains the various controls normally associated with such numerically controlled lathes, including a master off/on switch, cycle START and STOP controls, a spindle on/off control, a rotation direction control, feed rate override control, spindle speed override control, slide and carriage manual movement controls, and a feed hold control.

The bed 14 is provided on its upper surface with a pair of tracks 30, 32 which extend parallel to one another and to the longitudinal axis of the bed 14. A carriage 34 has detents (36, 38) and suitable bearings (not shown) such that it freely rides on the tracks 30, 32. The position of carriage 34 on the bed 14 is determined by a screwdrive comprising drive motor 40 which rotatably drives a screw shaft 42. Drive motor 40 is controlled by computer control 12. The carriage 34 may, therefore, be predeterminedly positioned along the rotational axis 22 of the workpiece 20 in response to control signals from control unit 12.

The carriage 34 is provided with a pair of guide rails 44, 46 which are supported in parallel on the upper surface of the carriage 34, such that the guide rails 44, 46 are orthogonal with respect to the tracks 30, 31. Mounted on the rails 44, 46 is a slide 50. Slide 50 may be driven along the rails 44, 46 via a screwdrive comprised of drive motor 52 which rotatably drives a screw shaft 54. Drive motor 52 is under control of the computer control unit 12. The slide may, therefore, be driven in the radial axis 24 of the workpiece in response to control signals from computer control unit 12.

Affixed to the upper surface of the slide 50 is a tool receptacle 56 which, via a set screw 58, receives and supports a cutting tool 60. The cutting edge of the cutting tool 60 is positioned to engage the workpiece on the radial axis 24.

Full control of the rotation of the spindle assembly 18 and the relative position of the cutting tool, via the carriage drive motor 40 and slide drive motor 52, is provided by control signals emanating from the computer control 12. Computer control 12 is comprised of a user terminal 61 and an associated logic unit 62. A multiconductor bus 64 connects the logic unit 62 to the numerically controlled lathe 10.

The user's terminal 61 is provided with a cathode ray tube screen 70, keyboard 72 and a floppy disk drive 74. System data may be input, therefore, by user keyboard entry and/or magnetic disk. In addition, a tape reader 75 provides punched tape control of the logic unit 62. Data input via terminal 61 is routed via a bus (not shown) to the logic unit 62.

It should be understood that the user terminal 61 and logic unit 62 may be provided as an integrated unit.

As will be described in detail herein below, the logic unit 62 responds to input command signals to produce a series of control signals which, when applied to the numerically controlled lathe 10, cause the cutting tool 60 to be positioned such that three dimensional contours may be cut into the workpiece 20.

In one construction of the invention, the numerically controlled lathe was a model number 2010 American NC lathe, manufactured by American Tool Company, Cincinnati, Ohio. The associated computing unit 12 was comprised of an Alan Bradley type 7320 computer, manufactured by Alan Bradley Company Cleveland, Ohio.

Figure 2:
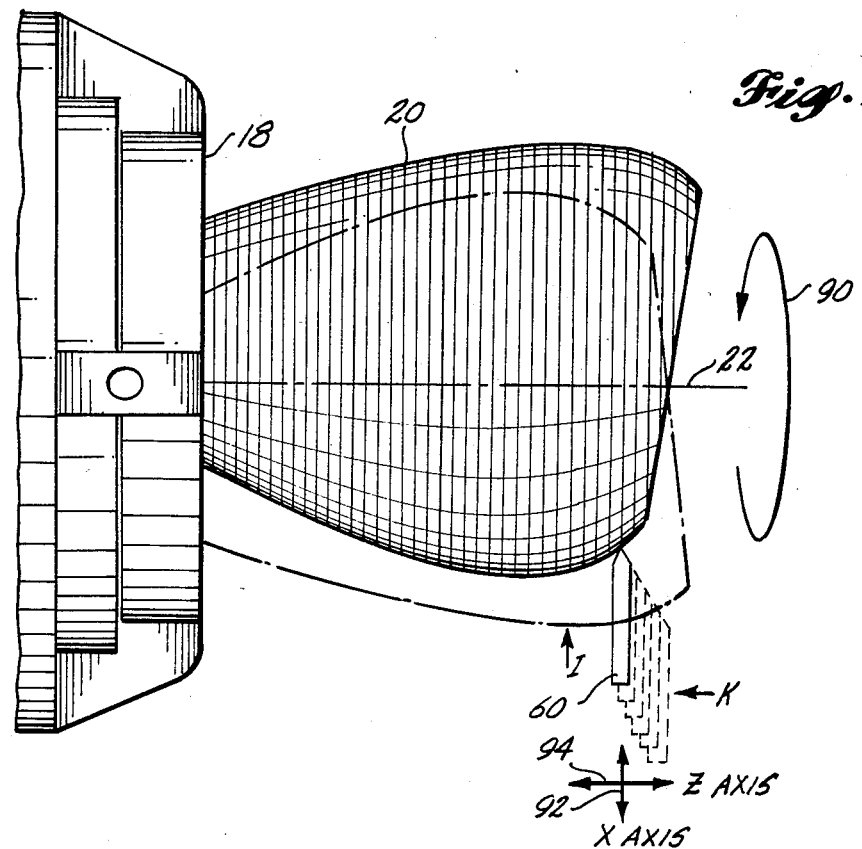
FIG. 2 is a plan view illustrating the x, z, i and k coordinates which define positioning of the cutting tool with respect to the spindle mounted workpiece.

FIG. 2 is a plan view from above of the numerically controlled lathe showing a rotating spindle 18 to which is affixed, for rotation therewith, the workpiece 20. For the numerically controlled lathe of FIG. 1, the workpiece is rotated in a counterclockwise direction, indicated by an arrow 90, as viewed down the rotational axis 22 towards the spindle 18.

For reference purposes, four coordinates, and correspondingly four control signals, define the position of the cutting tool 60 with respect to the workpiece 20 as the workpiece rotates. The relative position of the tool 60 is defined by an x coordinate, along an x axis perpendicular to the rotational axis 22, as indicated by arrow 92. The position of the cutting tool 60 along the rotational axis 22 of the workpiece is defined by a z coordinate on a z axis, indicated at 94.

The distance traveled by the cutting tool 60 along the x axis for each revolution of the workpiece is defined by a coordinate i. Correspondingly, the distance traveled by the cutting tool 60 along the z axis 94 for each revolution of the workpiece 20 is defined by a coordinate k.

For the numerically controlled lathe of the type shown in FIG. 1, the i and k control signals are normally input to define a desired threading of the workpiece. As will be understood more fully upon review of the discussion hereinbelow, the use of the i and k control signals in the present invention provides the necessary extra data beyond positional coordinates to operate the cutting tool 60 to realize three dimensional contours in the workpiece 20.

Figure 3:
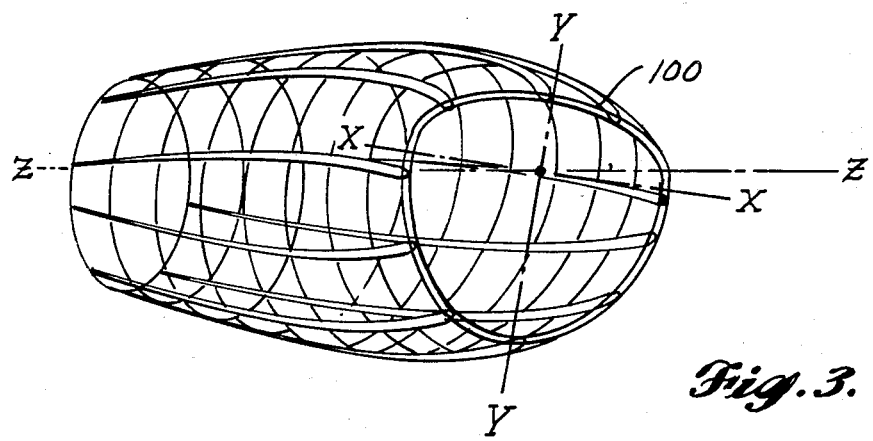
FIG. 3 depicts a Cartesian coordinate system used to define the nacelle cowl in accordance with the present method.

FIG. 3 depicts the desired final machined shape of the workpiece into the form of a nacelle cowl. Here, in the conventional manner, the shape of the cowl is defined by a series of loft lines, such as initial loft line 100. The loft lines are defined by Cartesian coordinates X, Y and Z. As shown, the Z coordinate is parallel to the longitudinal axis of the nacelle cowl. Each loft line is defined by a locus of X, Y points, at a given Z coordinate value. In this way, and by using a sufficient number of loft, or contour lines, a designer may geometrically define the desired shape of the machined part, herein the nacelle cowl.

Figure 4:
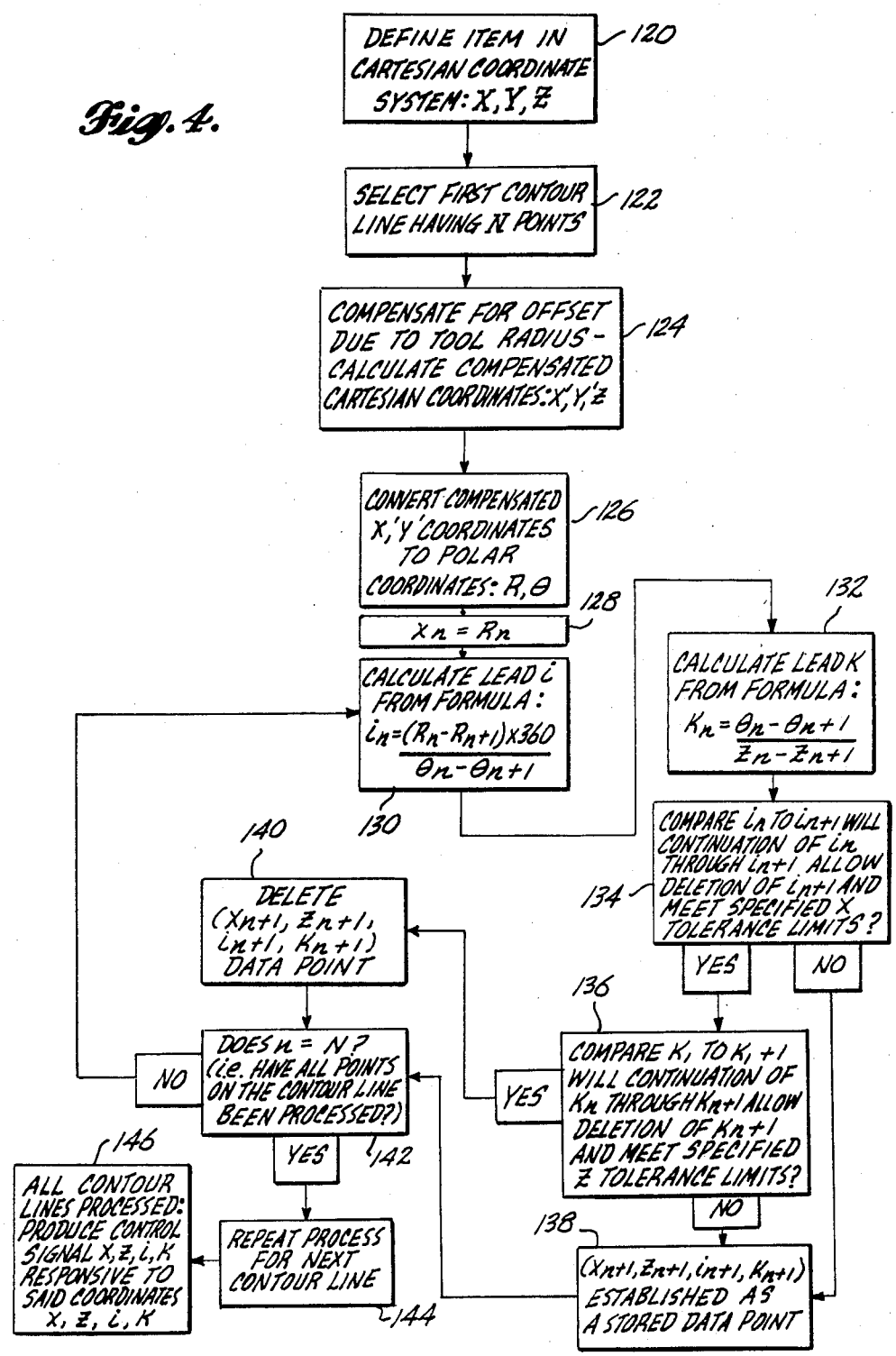
FIG. 4 is a block diagram illustrating the logic flow steps performed by the present method.

FIG. 4 is a logic flow diagram illustrating the preferred steps, in their preferred sequence performed in the method according to the present invention.

Preferably, the part to be machined, here, for example a nacelle cowl for a model aircraft, is defined in a Cartesian coordinate system using coordinate axes X, Y and Z. Such definition has been described with respect to FIG. 3, and is shown for the contour 100 of FIG. 3 in FIGS. 5A and 5B. FIG. 5A is a plan, end view of the nacelle cowl showing the contour line 100. A Cartesian coordinate system comprised of horizonal axis X, and vertical axis Y is shown, with the origin at the rotational axis 102 of the nacelle cowl.

FIG. 5B is a plan, side view of the nacelle cowl, and illustrates the Z Cartesian coordinate axis which runs coincident with the rotational axis 102.

Referring again to FIG. 4, at block 122 a series of N data points are selected to define each contour. Referring to FIGS. 5A and 5B, the first data point selected is at coordinates $X_1$, $Y_1$, and $Z_1$. In a similar manner, additional data points are identified around the contour 100 such that the contour line 100 is defined to acceptable limits.

Next, at block 124 of FIG. 4, compensation is made for offset due to the radius of the cutting tool. Thus, referring to FIG. 5A, the radius of the cutting tool is depicted by the circle 104 with a center point $x_1'$, $y_1'$ representing the cutter compensated data point. If the command to the cutting tool were not compensated to account for the radius of the tool, errors would result in the machined workpiece. Such compensation may be made either as a result of a geometric analysis of the position of the cutting tool and its radius with respect to the workpiece at a given cut point, or the desired compensation may be made empirically. Referring to FIG. 5B, it will be noted that the Z coordinate changes from $Z_1$ to $z_1$ to compensate for the cutting tool radius.

Next, referring to block 126 of FIG. 4, the compensated coordinates $x'$, $y'$ are converted to polar coordinates of radius R and angle $\theta$.

FIGS. 6A and 6B parallel FIGS. 5A and 5B in that shown is the plan end, and side views respectively of the nacelle cowl, at a contour line 100. Referring to FIG. 6A, a series of three data points $x_1'$, $y_1'$ through $x_3'$, $y_3'$ are illustrated. As shown, these points have been compensated for the cutting tool radius. A corresponding set of radii $R_1$-$R_3$ are shown extending from the axis of rotation 102 to each of these data points. In addition, angles, such as $\theta_2$, $\theta_3$ are shown from an initial reference angle, here being the zero angle line coincident with the radius $R_1$.

The conversion from Cartesian coordinates to polar coordinates is done in a conventional manner, using the Pythagorean theorem.

From block 128 of FIG. 4, a coordinate $x_n$ is defined as equalling $R_n$ for all of the data points along the contour 100, where n is understood to represent the nth data point, with n varying from 1 to N. The thus defined $x_n$ coordinate is seen to be the desired cutting tool position in the x axis of FIG. 2 with respect to the rotational axis 102 of the workpiece 20.

Next, from block 130 of FIG. 4, the lead coordinate i is calculated. This coordinate is calculated in accordance with the formula:

$$i_n = \frac{(R_n - R_{n+1}) \times 360°}{(\theta_n - \theta_{n+1})}, \quad (1)$$

where the subscript n denotes the nth value, with n varying from 1 to N. Thus, the i coordinate represents the total distance traveled per workpiece revolution of the cutting tool in the x axis.

From FIG. 4, the next step, at block 132, is to calculate the lead k coordinate from the formula:

$$k_n = \frac{(\theta - \theta_{n+1}) \times 360°}{(z_n - z_{n+1})}, \quad (2)$$

wherein, again, n represents the nth value, with n varying from 1 to N.

Figures 7A, 7B:
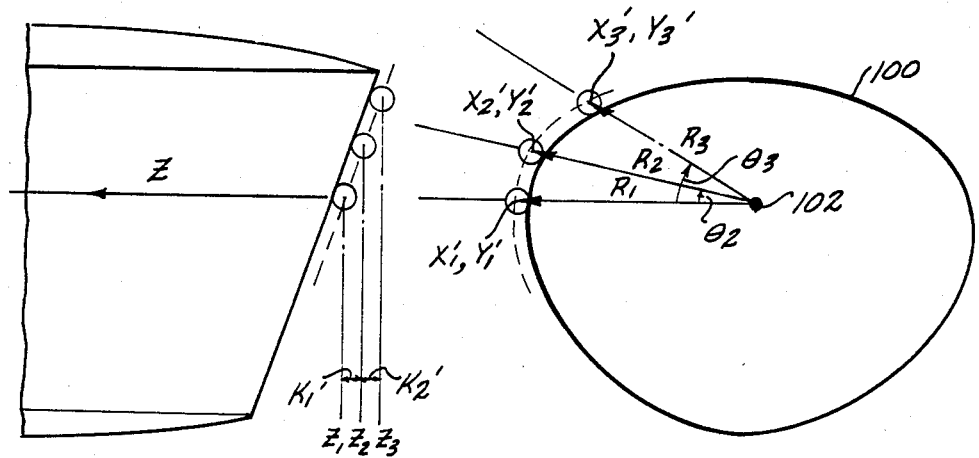
FIGS. 7A and 7B are face and side plan views, respectively, of a contour of the desired machined workpiece illustrating the derivation of the i and k coordinates.

FIGS. 7A, 7B depict calculation of the k coordinate. As with FIGS. 5A and 6A, FIG. 7A is a plan, end view of the nacelle cowl showing the contour 100. FIG. 7B, as with FIGS. 5B and 6B, is a plan, side view of the cowl. The three data points, which have been compensated for cutting tool radius, are indicated as $x_1'$, $y_1'$ through $x_3'$, $y_3'$. Each data point has a corresponding radius $R_1$-$R_3$, and a corresponding angle $\theta_1$ (where $\theta_1 = 0$) through $\theta_3$.

Referring to FIG. 7B, the three data points $x_1'$, $y_1'$ through $x_3'$, $y_3'$ have corresponding z coordinates $z_1$ through $z_3$. The k coordinate represents the movement of the cutting tool in the z axis per revolution of the workpiece. Thus, the distance in the z axis between the first two points $z_1$, $z_2$ represents a $k_1'$ coordinate, where $k_1'$ is equal to $k_1/360°$.

Similarly, the difference between the second and third Z coordinates $z_2$, $z_3$, respectively, corresponds to a coordinate $k_2'$, where $k_2' = k_2/360°$.

In this manner, the k coordinate, corresponding to the distance traveled per workpiece revolution in the z axis of the cutting tool is determined.

In the above manner, coordinates $x_n$, $z_n$, $i_n$ and $k_n$ may be determined for each point around the contour of the desired machined workpiece shape. If corresponding coordinates are determined for each loft contour, sufficient information may be supplied to the numerically controlled lathe of FIG. 1 to form the desired three dimensional contouring in the workpiece. However, it is desirable to reduce the total number of data points which must be stored by the computer and applied to the lathe to thereby reduce necessary storage capacity of the computer and, correspondingly, machining time on the lathe.

To reduce the total number of data points required to define the three dimensional cuts required in the workpiece, a "filtering" process is used, as is understood as follows.

Referring to block 134 of FIG. 4, a comparison is made between the i coordinate $i_{n+1}$ of a successive data point, with the i coordinate $i_n$ of an immediately preceding data point. A test is made to determine whether a continuation of the $i_n$ value through the $i_{n+1}$ coordinate will allow deletion of the data point containing the coordinate $i_{n+1}$. This test is based upon an x tolerance limit being defined for the particular part being machined. Thus, if continuation of the $i_n$ lead coordinate through the successive data point containing $i_{n+1}$ produces an arc which is within the defined x tolerance for the successive point, the test at block 134 is passed, with a "yes" or flagged output leading to block 136.

At block 136, a comparison is made between the k coordinate $k_{n+1}$ of a successive data point to the k coordinate $k_n$ of the immediately preceding data point. Here, a test is made to determine whether a continuation of the $k_n$ lead through the data point containing $k_{n+1}$ will be within a specified z tolerance limit.

If the answer is "no" to the test performed at either of blocks 134 or 136, the successive data point ($x_{n+1}$, $z_{n+1}$, $i_{n+1}$ and $z_{n+1}$) may not be deleted and is thereby established as a stored data point at block 138. If, however, the tests at block 134 and 136 are both "yes," (i.e., both blocks 134, 136 are flagged) the successive data point ($x_{n+1}$, $z_{n+1}$, $i_{n+1}$ and $k_{n+1}$) may be deleted as a data point, as indicated at block 140.

Figures 8A, 8B:
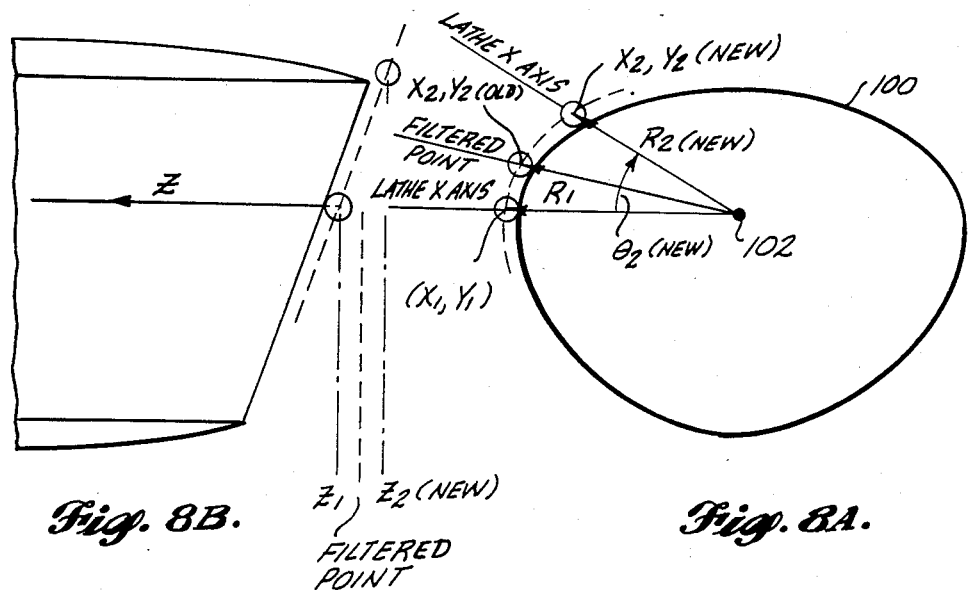
FIGS. 8A, 8B are face and side plan views, respectively, of a contour of the desired workpiece illustrating the present method for reducing the number of stored data points required to define the positioning of the cutting tool.

FIGS. 8A and 8B depict this "filtering" process in diagrammatic form.

As with FIGS. 5A through 7A, FIG. 8A is a plan, end view of the nacelle cowl illustrating the contour 100. Similarly, FIG. 8B is a plan, side view of the cowl.

Here, following the tests performed at blocks 134, 136 of FIG. 4, it has been determined that the data point $x_2$, $z_2$, $i_2$, $k_2$, may be filtered, or deleted from the data points which define the contour 100, inasmuch as continuation of the i lead coordinate through the second data point is within a defined x tolerance and continuation of the $k_i$ lead coordinate through the second data point is within a defined z tolerance. This point being deleted, the third point $x_3$, $y_3$, $z_3$ becomes the new second data point, $x_2$, $y_2$, $z_2$, with a corresponding radius $R_2$ (new) and angle $\theta_2$ (new).

As will be readily understood, the above described filtering process may be used to substantially reduce the number of data points required to define a given contour in accordance with the present method.

Referring again to FIG. 4, a test is performed, at block 142, to determine whether or not n=N, that is, whether all of the points on the contour have been processed. If the answer is "no" the system returns to block 130 to calculate the lead coordinate i for the next data point. If, however, all points on a contour have been processed, this system increments to block 144 whereby the process is repeated for the next contour line.

When all contours have been processed, the part has been fully described in terms of x, z, i and k coordinates, which are stored within memory of a computing unit, such as computing unit 12 of FIG. 1. Now, at block 146, the computer processes each contour coordinate, x, z, i and k to produce a corresponding control signal x, z, i, k for application to a numerically controlled lathe, such as lathe 10 of FIG. 1.

As the workpiece is rotated through each defined segment of rotation, a new control signal x, z, i, k is input to appropriately reposition the cutting tool. For example, in the machining of the nacelle cowl as shown in FIG. 1, a revolution of the workpiece is broken down into thirty-six (36) equal segments (i.e., ten degrees per segment). At each ten degree increment of workpiece rotation, a new control signal x, z, i and k is input to the lathe to control the position of the cutting tool in its x and z axes. For data points that were "filtered" or deleted from the data set, the lathe operates on a successive ten degree segment using the control signals from the preceding ten degree segment.

In summary, a method for machining three dimensional contours in a workpiece utilizing a numerically controlled lathe has been described in detail. The described method further includes a method for deleting data points which are not necessary to maintain the contour of the workpiece within a desired tolerance. By deleting, or filtering, such data points, the method is capable of reducing the volume of data points which must be stored in the memory of a computing unit, and correspondingly, reducing the machining time necessary to machine a desired part.

While a preferred embodiment of the invention has been described in detail, it should be apparent that many modifications and variations thereto are possible, all of which fall within the true spirit and scope of the invention.

For example, the control signals described above utilize x, z, i and k representative values. It should be understood that different numerically controlled lathes may require a different designation of the control inputs. Such a variation in designation is within the scope of this invention.

The embodiments of the invention in which an exclusive property or privilege is claimed are defined as follows:

1. A method for machining a workpiece comprising the steps of:
   (a) providing a rotatable lathe spindle including means for mounting the workpiece thereto such that the workpiece may be rotated about a rotational axis;
   (b) providing a cutting tool;
   (c) positioning said cutting tool in response to control signals with respect to both a first axis perpendicular to the axis of rotation of the spindle mounted workpiece and a second axis parallel to the axis of rotation of the spindle mounted workpiece; and
   (d) producing a predetermined set of control signals x, z, i and k for each predetermined segment of rotation of the workpiece, wherein each x control signal defines the position of the cutting tool in said first axis, each z control signal defines the position of the cutting tool in said second axis, each i control signal defines the distance traveled by the cutting tool in said first axis for each revolution of the workpiece and each k control signal defines the distance traveled by the cutting tool in said second axis for each revolution of the workpiece, said step (d) comprising the steps of:
   (i) defining the desired machined shape of the workpiece in a Cartesian coordinate system using mutually orthogonal axes having corresponding coordinates X, Y and Z;
   (ii) compensating said X, Y and Z coordinates for offsets produced by the cutting tool to produce coordinates x', y' and z;
   (iii) converting said compensated x', y' coordinates to corresponding polar coordinates of radius R and angle $\theta$;
   (iv) defining a set of x coordinates, each x coordinate being predeterminedly related to one of said R coordinates;
   (v) calculating a set of i coordinates, each i coordinate being a predetermined function of said R and $\theta$ coordinates;
   (vi) calculating a set of k coordinates, each k coordinate being a predetermined function of said z and $\theta$ coordinates; and
   (vii) producing said x, z, i and k control signals in response to said x, z, i and k coordinates, respectively.

2. The method of claim 1 wherein step (i) comprises the step of selecting a total of N, X, Y data point pairs to define each desired contour of the workpiece at a corresponding Z coordinate, where N is a predetermined integer.

3. The method of claim 2, wherein step (v) comprises the step of calculating each i coordinate in accordance with:

$$i_n = \frac{(R_n - R_{n+1}) \times 360°}{(\theta_n - \theta_{n+1})},$$

where the subscript n denotes the nth coordinate, with n varying in integer values from 1 to N.

4. The method of either one of claims 2 or 3 wherein step (vi) comprises the step of calculating each k coordinate in accordance with:

$$k_n = \frac{(\theta_n - \theta_{n+1}) \times 360°}{(z_n - z_{n+1})},$$

where the subscript n denotes the nth coordinate, with n varying in integer values from 1 to N.

5. The method of any one of claims 1 or 3 comprising the further steps of:
 (e) comparing successive i, k control signals to the immediately preceding i, k control signals; and
 (f) deleting those x, z, i and k control signals whose i, k values are predeterminedly related to the i, k values of the immediately preceding control signal.

6. The method of claim 4, comprising the further steps of:
 (e) comparing successive i, k control signals to the immediately preceding i, k control signals; and
 (f) deleting those x, z, i and k control signals whose i, k values are predeterminedly related to the i, k values of the immediately preceding control signal.

7. A method for machining a workpiece comprising the steps of:
 (a) providing a rotatable lathe spindle including means for mounting the workpiece thereto such that the workpiece may be rotated about a rotational axis;
 (b) providing a cutting tool;
 (c) positioning said cutting tool in response to control signals with respect to both a first axis perpendicular to the axis of rotation of the spindle mounted workpiece and a second axis parallel to the axis of rotation of the spindle mounted workpiece; and
 (d) producing a predetermined set of control signals x, z, i and k for each predetermined segment of rotation of the workpiece, wherein each x control signal defines the position of the cutting tool in said first axis, each z control signal defines the position of the cutting tool in said second axis, each i control signal defines the distance traveled by the cutting tool in said first axis for each revolution of the workpiece, and each k control signal defines the distance traveled by the cutting tool in said second axis for each revolution of the workpiece, said step (d) comprising the steps of:
 (i) defining the desired machined shape of the workpiece in a Cartesian coordinate system having mutually orthogonal axes with corresponding coordinates X, Y and Z, the Z coordinate axis being parallel to the axis of rotation of the workpiece;
 (ii) selecting a total of N, X, Y data pairs to define each desired contour of the workpiece at a corresponding Z coordinate, where N is a predetermined integer;
 (iii) compensating said X, Y and Z coordinates for offsets produced by the cutting tool to produce coordinates x', y' and z;
 (iv) converting said compensated x', y' coordinates to corresponding polar coordinates of radius R and angle $\theta$;
 (v) producing a set of x coordinates, each x coordinate being predeterminedly related to one of said R coordinates;
 (vi) calculating a set of i coordinates, each i coordinate being produced in accordance with:

$$i_n = \frac{(R_n - R_{n+1}) \times 360°}{(\theta_n - \theta_{n+1})},$$

where the subscript n denotes at the nth coordinate, with n varying in integer values from 1 to N;
 (vii) calculating a set of k coordinates, each k coordinate being produced in accordance with:

$$k_n = \frac{(\theta_n - \theta_{n+1}) \times 360°}{(z_n - z_{n+1})},$$

where the subscript n denotes the nth coordinate, with n varying in integer values from 1 to N; and
 (viii) producing said x, z, i and k control signals responsive to said x, z, i and k coordinates, respectively.

8. The method of claim 7 comprising the further steps of:
 (e) defining a tolerance for the x coordinates;
 (f) defining a tolerance for the z coordinates;
 (g) comparing each successive $i_{n+1}$ coordinate value with its preceding $i_n$ coordinate value and identifying the condition wherein continuation of the $i_n$ coordinate value through the $i_{n+1}$ coordinate value will be within said defined x coordinate tolerance;
 (h) comparing each successive $k_{n+1}$ coordinate value with its preceding $k_n$ coordinate value and identifying the condition wherein continuation of the $k_n$ coordinate value through the $k_{n+1}$ coordinate value will be within said defined z coordinate tolerance; and
 (i) deleting each control signal set $x_{n+1}$, $z_{n+1}$, $i_{n+1}$, $k_{n+1}$ having the identified conditions of both of steps (g) and (h).

9. A method for machining three dimensional contours in a workpiece comprising the steps of:
 (a) providing a numerically controlled lathe, the lathe having a rotatable spindle and mounting means for mounting the workpiece to the spindle for rotation therewith about a workpiece rotational axis, the lathe further including a cutting tool mounted to positioning means, the positioning means being responsive to:
 (i) an x control signal to define the position of the cutting tool with respect to the radial axis of the workpiece,
 (ii) a z control signal to define the position of the cutting tool with respect to the rotational axis of the workpiece; p2 (iii) an i control signal to define the distance traveled by the cutting tool in the radial axis of the workpiece for each revolution thereof, and (iv) a k control signal to define the distance traveled by the cutting tool with respect to the rotational axis of the workpiece for each revolution thereof; and (b) producing a succession of predetermined x, z i and k control signals, each control signal being produced for a predetermined segment of rotation of the workpiece, the x, z, i and k control signals being suitable for control of said positioning means such that a contour predeterminedly varying in three dimensions is cut by the cutting tool in the workpiece, step (b) comprising the steps of:

(i) defining the desired machined shape of the workpiece in a Cartesian coordinate system using three mutually orthogonal axes having X, Y and Z coordinates;

(ii) compensating said X, Y and Z coordinates for offsets produced by the radius of the cutting tool to produce coordinates x', y', and z;

(iii) converting said compensated x' and y' coordinates to polar coordinates of radius R and angle $\theta$;

(iv) producing a set of x coordinates, each x coordinate being predeterminedly related to a corresponding R coordinate;

(v) calculating a set of i coordinates, each i coordinate being a predetermined function of each of said R and $\theta$ coordinates;

(vi) calculating a set of k coordinates, each k coordinate being a predetermined function of each of said z and $\theta$ coordinates; and (vii) producing said x, z, i and k control signals responsive to said x, z, i and k coordinates, respectively.

10. The method of claim 9 wherein step (i) comprises the step of selecting a total of N, X, Y Cartesian data points to define each desired contour of the workpiece at a corresponding Z coordinate, where N is a predetermined integer.

11. The method of claim 10 wherein step (v) comprises the step of calculating each i coordinate in accordance with:

$$i_n = \frac{(R_n - R_{n+1}) \times 360°}{(\theta_n - \theta_{n+1})},$$

where the subscript n denotes the nth coordinate, with n varying in integer values from 1 to N.

12. The method of either one of claims 10 or 11 wherein step (vi) comprises the step of calculating each k coordinate in accordance with:

$$k_n = \frac{(\theta_n - \theta_{n+1}) \times 360°}{(z_n - z_{n+1})},$$

where the subscript n denotes the nth coordinates, with n varying from 1 to N.

13. The method of any of one of claims 9, 10 or 11 comprising the further steps of:

(c) storing said produced x, z, i and k control signals in a memory for subsequent application to said positioning means; and (d) processing said produced x, z, i and k control signals and deleting from said memory each x, z, i, k control signal which is within a predetermined tolerance from its preceding control signal, to thereby reduce the number of control signals necessary to produce the desired machined workpiece.

14. The method of claim 13 wherein step (d) comprises the steps of:

(i) defining an x tolerance for one of said x coordinate and said x control signal;

(ii) defining a z tolerance for one of said z coordinate and said z control signal;

(iii) comparing each control signal i value to the i value of the immediately preceding control signal and flagging the condition of a continuation of said previous i value to the present i value being within said x tolerance;

(iv) comparing each control signal k value to the k value of the immediately preceding control signal and flagging the condition of a continuation of said previous k value to the present k value being within said z tolerance; and (v) deleting from said memory each control signal having both its i and k values flagged in accordance with preceding steps (iii) and (iv).

15. The method of claim 12, comprising the further steps of:

(c) storing said produced x, z, i and k control signals in a memory for subsequent application to said positioning means; and (d) processing said produced x, z, i and k control signals and deleting from said memory each x, z, i, k control signal which is within a predetermined tolerance for its preceding control signal, to thereby reduce the number of control signals necessary to produce the desired machined workpiece.

16. The method of claim 15 wherein step (d) comprises the steps of:

(i) defining an x tolerance for one of said x coordinate and said x control signal;

(ii) defining a z tolerance for one of said z coordinate and said z control signal;

(iii) comparing each control signal i value to the i value of the immediately preceding control signal and flagging the condition of a continuation of said previous k value to the present k value being within said z tolerance; and (iv) comparing each control signal k value to the k value of the immediately preceding control signal and flagging the condition of a continuation of said previous k value to the present k value being within said z tolerance; and (v) deleting from said memory each control signal having both its i and k values flagged in accordance with preceding steps (iii) and (iv).

17. A method for machining three dimensional contours in a workpiece comprising the steps of: p1 (a) providing a numerically controlled lathe, the lathe having a rotatable spindle and mounting means for mounting the workpiece to the spindle for rotation therewith about a workpiece rotational axis, the lathe further including a cutting tool mounted to positioning means, the positioning means being responsive to:

(i) an x control signal to define the position of the cutting tool with respect to the radial axis of the workpiece, (ii) a z control signal to define the position of the cutting tool with respect to the rotational axis of the workpiece;

(iii) an i control signal to define the distance traveled by the cutting tool in the radial axis of the workpiece for each revolution thereof, and (iv) a k control signal to define the distance traveled by the cutting tool with respect to the rotational axis of the workpiece for each revolution thereof; and (b) producing a succession of predetermined x, z, i and k control signals, each control signal being produced for a predetermined segment of rotation of the workpiece, the x, z, i and k control signals being suitable for control of said positioning means such that a contour predeterminedly varying in three dimensions is cut by the cutting tool in the workpiece, step (b) comprising the steps of:

(i) defining the desired machined shape of the workpiece in a Cartesian coordinate system having three mutually orthogonal axes with corresponding coordinates X, Y and Z;

(ii) selecting a total of N, X, Y data pairs to define each desired contour of the workpiece at a corresponding Z coordinate, where N is a predetermined integer;

(iii) compensating said X, Y and Z coordinates for cutting tool offsets to produce coordinates x', y', and z;

(iv) converting said compensated x', y' coordinates to corresponding polar coordinates of radius R and angle θ;

(v) producing a set of x coordinates, each x coordinate being predeterminedly related to one of said R coordinates;

(vi) calculating a set of i coordinates in accordance with:

$$i_n = \frac{(R_n - R_{n+1}) \times 360°}{(\theta_n - \theta_{n+1})},$$

where the subscript n denotes the nth value, with n varying in integer values from 1 to N;

(vii) calculating a set of k coordinates, each k coordinate being produced in accordance with:

$$k_n = \frac{(\theta_n - \theta_{n+1}) \times 360°}{(z_n - z_{n+1})},$$

where the subscript n denotes the nth value, with n varying in integer values from 1 to N; and (viii) producing said x, z, i and k control signals responsive to said x, z, i and k coordinates, respectively.

18. The method of claim 17 comprising the further steps of:

(c) storing said produced x, z, i and k control signals in a memory for subsequent application to said positioning means; and (d) processing said produced x, z, i and k control signals and deleting from said memory each x, z, i and k control signal which is within a predetermined tolerance from its preceding control signal to thereby reduce the number of control signals necessary to produce the desired machined workpiece.

19. The method of claim 18 wherein step (d) comprises the steps of:

(i) defining an x tolerance for one of said x coordinate and said x control signal, (ii) defining a z tolerance for one of said z coordinate and said z control signal;

(iii) comparing each control signal i value to the i value of the immediately preceding control signal and flagging the condition of a continuation of said previous i value to the preset i value being within said x tolerance;

(iv) comparing each control signal k value to the k value of the immediately preceding control signal and flagging the condition of a continuation of said previous k value to the present k value being within said z tolerance; and (v) deleting from said memory each control signal having both its i and k values flagged in accordance with preceding steps (iii) and (iv).

* * * * *